United States Patent
Yakub et al.

(10) Patent No.: US 10,811,245 B2
(45) Date of Patent: *Oct. 20, 2020

(54) FLOAT ZONE SILICON WAFER MANUFACTURING SYSTEM AND RELATED PROCESS

(71) Applicant: Rayton Solar Inc., Santa Monica, CA (US)

(72) Inventors: Andrew X. Yakub, Stevenson Ranch, CA (US); James Benjamin Rosenzweig, Los Angeles, CA (US); Mark Stanley Goorsky, Valencia, CA (US)

(73) Assignee: Rayton Solar Inc., Van Nuys, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/354,957

(22) Filed: Nov. 17, 2016

(65) Prior Publication Data

US 2017/0069482 A1 Mar. 9, 2017

Related U.S. Application Data

(63) Continuation of application No. 14/625,544, filed on Feb. 18, 2015, now Pat. No. 9,499,921, which is a
(Continued)

(51) Int. Cl.
*H01L 21/02* (2006.01)
*C30B 13/20* (2006.01)
(Continued)

(52) U.S. Cl.
CPC .......... *H01L 21/02035* (2013.01); *B28D 5/00* (2013.01); *C30B 13/20* (2013.01);
(Continued)

(58) Field of Classification Search
CPC .............. H01L 2924/00; H01L 21/268; H01L 21/2636; H01L 21/3225; H01L 21/265;
(Continued)

(56) References Cited

U.S. PATENT DOCUMENTS 3,453,097 A 7/1969 Hafner
4,309,239 A 1/1982 Fumeton
(Continued)

FOREIGN PATENT DOCUMENTS

| JP | 2010-3899 | 1/2010 |
|---|---|---|
| WO | WO9852212 | 11/1998 |
| WO | WO2007016895 | 2/2007 |

OTHER PUBLICATIONS

Meroli, Stefano, Two growth techniques for mono-crystalline silicon: Czochralski vs Float Zone. Published Apr. 25, 2012 as viewed at http://meroli.web.cern.ch/meroli/Lecture_silicon_floatzone_czochralski.html on Nov. 9, 2015.
(Continued)

*Primary Examiner* — Jodi C Franklin
(74) *Attorney, Agent, or Firm* — Lowry Blixseth APC; Scott M. Lowry

(57) ABSTRACT

The process for manufacturing a silicon wafer includes steps for mounting a float zone silicon work piece for exfoliation, energizing a microwave device for generating an energized beam sufficient for penetrating an outer surface layer of the float zone silicon work piece, exfoliating the outer surface layer of the float zone silicon work piece with the energized beam, and removing the exfoliated outer surface layer from the float zone silicon work piece as the silicon wafer having a thickness less than 100 micrometers.

21 Claims, 10 Drawing Sheets

Related U.S. Application Data continuation-in-part of application No. 13/954,868, filed on Jul. 30, 2013, now Pat. No. 9,404,198.

(60) Provisional application No. 61/941,325, filed on Feb. 18, 2014, provisional application No. 61/677,392, filed on Jul. 30, 2012.

(51) Int. Cl.

| | | |
|---|---|---|
| *C30B 13/24* | (2006.01) | |
| *C30B 29/06* | (2006.01) | |
| *C30B 29/64* | (2006.01) | |
| *B28D 5/00* | (2006.01) | |
| *C30B 33/06* | (2006.01) | |
| *C30B 33/02* | (2006.01) | |
| *H01L 21/263* | (2006.01) | |

(52) U.S. Cl.
CPC .............. *C30B 13/24* (2013.01); *C30B 29/06* (2013.01); *C30B 29/64* (2013.01); *C30B 33/02* (2013.01); *C30B 33/06* (2013.01); *H01L 21/263* (2013.01); *Y10T 117/1088* (2015.01)

(58) Field of Classification Search
CPC ......... H01L 21/26506; H01L 21/26513; H01L 23/373
See application file for complete search history.

(56) References Cited

U.S. PATENT DOCUMENTS

| | | | |
|---|---|---|---|
| 4,568,407 A | | 2/1986 | Barbieri et al. |
| 4,733,091 A * | | 3/1988 | Robinson .......... H01L 21/68707 118/730 |
| 4,878,570 A * | | 11/1989 | Zlotek ...................... C23C 14/48 192/107 T |
| 5,338,940 A * | | 8/1994 | Takeyama ........... H01J 37/3171 250/400 |
| 5,808,274 A | | 9/1998 | Lee |
| 5,920,076 A * | | 7/1999 | Burgin .................. H01J 27/022 250/423 R |
| 5,950,643 A | | 9/1999 | Miyazaki et al. |
| 6,013,563 A | | 1/2000 | Henley et al. |
| 6,220,056 B1 | | 4/2001 | Ostendarp |
| 6,407,505 B1 | | 6/2002 | Bertsche |
| 6,423,930 B1 | | 7/2002 | Matsumoto |
| 6,528,391 B1 | | 3/2003 | Henley et al. |
| 6,568,384 B1 | | 5/2003 | Onizaki |
| 6,582,999 B2 | | 6/2003 | Henley et al. |
| 6,602,736 B1 | | 8/2003 | Matsuoka et al. |
| 6,632,724 B2 | | 10/2003 | Henley et al. |
| 6,818,529 B2 | | 11/2004 | Bachrach et al. |
| 6,889,108 B2 | | 5/2005 | Tanaka et al. |
| 6,941,940 B1 | | 9/2005 | Zuvattari et al. |
| 7,223,155 B2 | | 5/2007 | Matsumoto |
| 7,648,409 B1 | | 1/2010 | Horiguchi et al. |
| 7,699,050 B2 | | 4/2010 | Oishi |
| 7,939,812 B2 | | 5/2011 | Glavish et al. |
| 7,954,449 B2 | | 6/2011 | Duff et al. |
| 7,964,275 B2 | | 6/2011 | Muller et al. |
| 7,975,362 B2 | | 7/2011 | Gysi et al. |
| 7,976,629 B2 * | | 7/2011 | Brailove ................ B28D 1/221 117/26 |
| 7,982,197 B2 | | 7/2011 | Smick et al. |
| 7,989,784 B2 | | 8/2011 | Glavish et al. |
| 8,044,374 B2 | | 10/2011 | Rydling et al. |
| 8,146,581 B2 | | 4/2012 | Kitagawa et al. |
| 8,212,180 B2 | | 7/2012 | Eberhardt et al. |
| 8,449,285 B2 | | 5/2013 | McGeehan |
| 2002/0056519 A1 | | 5/2002 | Henley et al. |
| 2002/0139307 A1* | | 10/2002 | Ryding ................ C23C 14/505 118/730 |
| 2003/0162367 A1 | | 8/2003 | Roche | 
| 2004/0083863 A1 | | 5/2004 | Nakashima |
| 2004/0140534 A1 | | 7/2004 | Yoshihara et al. |
| 2005/0011733 A1 | | 1/2005 | Imal et al. |
| 2005/0101109 A1 | | 5/2005 | Chin et al. |
| 2005/0217718 A1 | | 10/2005 | Dings et al. |
| 2005/0227020 A1 | | 10/2005 | Guzizovich |
| 2006/0163490 A1* | | 7/2006 | Tang ................. H01L 21/67109 250/443.1 |
| 2006/0213424 A1 | | 9/2006 | Mueller et al. |
| 2006/0278497 A1 | | 12/2006 | White et al. |
| 2007/0235070 A1 | | 10/2007 | Ila |
| 2007/0281239 A1 | | 12/2007 | Uematsu et al. |
| 2007/0281399 A1* | | 12/2007 | Cites ................ H01L 21/26506 438/149 |
| 2008/0124903 A1* | | 5/2008 | England ............. H01J 37/3171 438/530 |
| 2008/0146003 A1 | | 6/2008 | Want et al. |
| 2008/0179547 A1 | | 7/2008 | Henley et al. |
| 2008/0311342 A1 | | 12/2008 | Muller et al. |
| 2009/0042369 A1* | | 2/2009 | Henley ............. H01L 21/26506 438/463 |
| 2009/0056513 A1 | | 3/2009 | Baer |
| 2009/0084373 A1 | | 4/2009 | Oishi |
| 2009/0087631 A1 | | 4/2009 | Schulze et al. |
| 2009/0140177 A1 | | 6/2009 | Whittum et al. |
| 2009/0170298 A1* | | 7/2009 | Brailove ................ B28D 1/221 438/532 |
| 2009/0194162 A1 | | 8/2009 | Sivaram et al. |
| 2009/0209086 A1* | | 8/2009 | Tanaka ............. H01L 21/76254 438/458 |
| 2009/0256581 A1 | | 10/2009 | Lu et al. |
| 2009/0283866 A1 | | 11/2009 | Chulze et al. |
| 2010/0052218 A1 | | 3/2010 | Clark et al. |
| 2010/0127169 A1 | | 5/2010 | Whittum |
| 2010/0163462 A1 | | 7/2010 | Grabbe et al. |
| 2010/0327189 A1* | | 12/2010 | Ryding .................. H01J 37/20 250/492.21 |
| 2010/0330709 A1* | | 12/2010 | Kandatsu ................ C23C 14/48 438/5 |
| 2011/0037195 A1 | | 2/2011 | Hildeman et al. |
| 2011/0101247 A1* | | 5/2011 | Hilkene ................ B82Y 10/00 250/492.3 |
| 2011/0127139 A1 | | 6/2011 | Huang |
| 2011/0129403 A1 | | 6/2011 | Stoddard et al. |
| 2011/0158683 A1 | | 6/2011 | Okuda et al. |
| 2011/0158887 A1 | | 6/2011 | Stoddard et al. |
| 2011/0186554 A1 | | 8/2011 | Koyanagi et al. |
| 2011/0271908 A1 | | 11/2011 | Chang et al. |
| 2011/0300691 A1 | | 12/2011 | Sakamoto et al. |
| 2012/0135585 A1 | | 5/2012 | Shimoi et al. |
| 2012/0192848 A1* | | 8/2012 | Nakashima ......... B24B 27/0633 125/21 |
| 2012/0252195 A1* | | 10/2012 | Jones ...................... H01J 37/08 438/514 |
| 2013/0193617 A1 | | 8/2013 | Zhang |
| 2013/0270238 A1 | | 10/2013 | Nawrodt et al. |
| 2013/0292691 A1 | | 11/2013 | Henley et al. |
| 2014/0026617 A1* | | 1/2014 | Yakub ...................... C30B 33/04 65/31 |
| 2014/0053382 A1* | | 2/2014 | Yang ................... H01L 21/46 29/25.01 |
| 2014/0117384 A1 | | 5/2014 | Tam et al. |
| 2015/0221515 A1* | | 8/2015 | Ho ...................... H01L 21/26593 438/530 |
| 2016/0190640 A1* | | 6/2016 | Visco .................. H01M 10/052 429/322 |
| 2017/0069482 A1* | | 3/2017 | Yakub ...................... C30B 33/06 |

OTHER PUBLICATIONS

National Renewable Energy Laboratory, 10th Workshop on Crystalline Silicon Solar Cell Materials and Processes, NREL/BK-520-28844, Aug. 2000, National Renewable Energy Laboratory, 1617 Cole Boulevard, Golden Colorado 80401-3393.

* cited by examiner

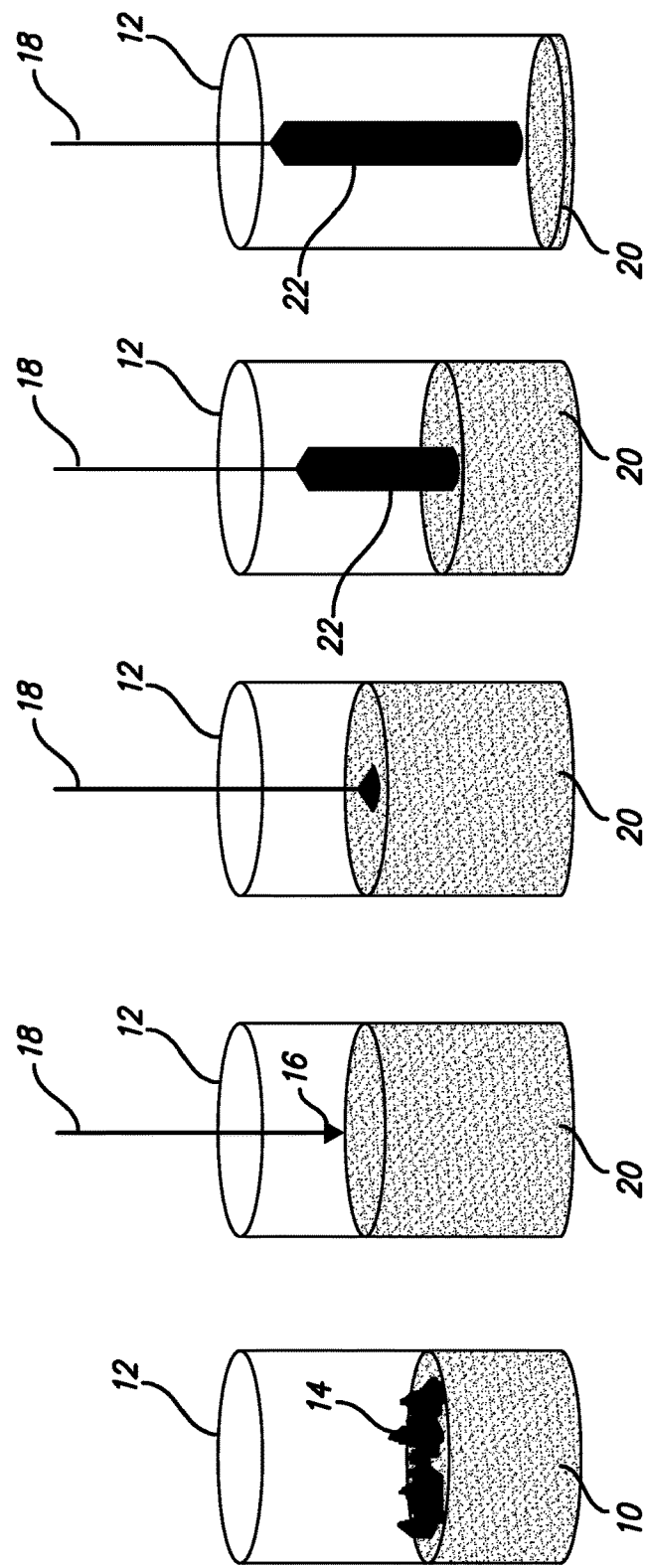

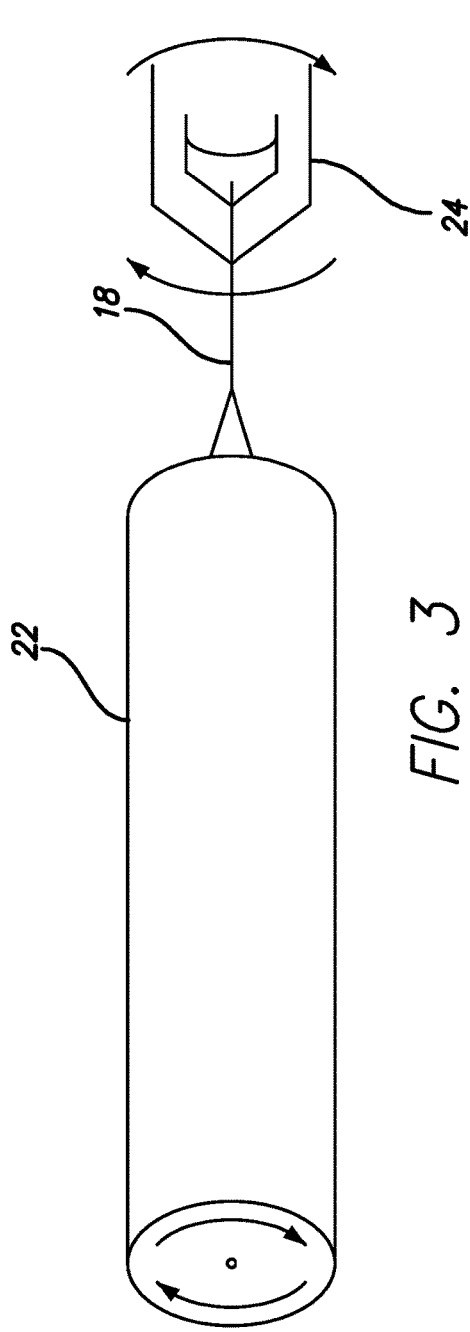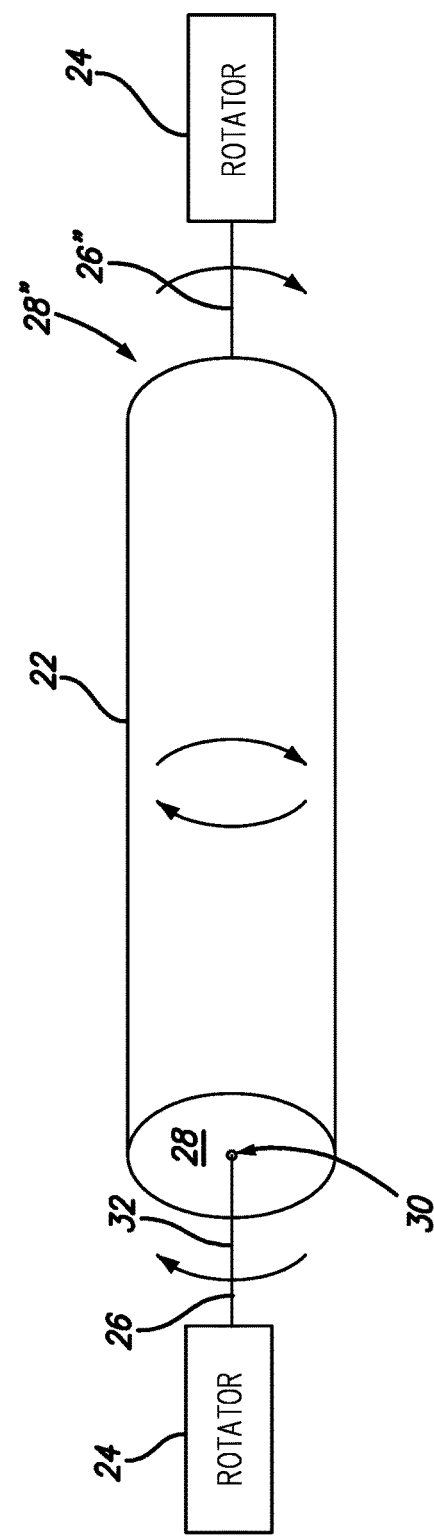

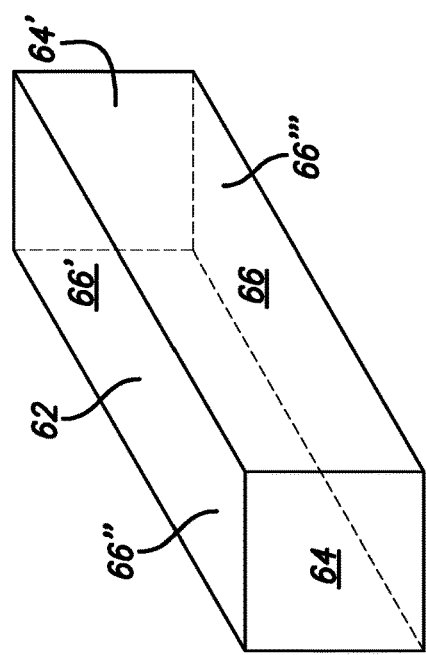
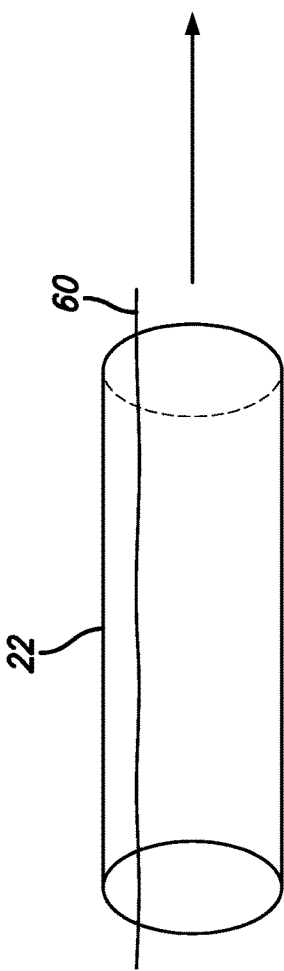
FIG. 11

FLOAT ZONE SILICON WAFER MANUFACTURING SYSTEM AND RELATED PROCESS

BACKGROUND OF THE INVENTION

The present invention generally relates to processes and apparatuses for manufacturing wafers. More particularly, the invention relates to processes and apparatuses for exfoliating the external surface of an ingot to more efficiently produce solar grade photovoltaic wafers and the like therefrom.

Conventionally, a wafer material such as monocrystalline silicon is processed into solar grade photovoltaic ("PV") wafers by first creating a single crystalline cylindrical ingot of silicon. The ingot is created by melting high-purity semiconductor-grade wafer material in an inert chamber, such as one made of quartz. Dopant impurity atoms such as boron, phosphorus, arsenic, or antimony may be added to the molten wafer material in precise amounts (e.g., on the order of $10^{13}$ or $10^{16}$ atoms per $cm^3$) to define the material as either a bulk n-type (negative) or p-type (positive) semiconductor, which gives the wafer material the desired electrical properties. Then, a rod-mounted seed crystal is dipped into the molten wafer material and slowly pulled upwards and rotated simultaneously to extract a preferably single-crystal cylindrical ingot. Controlling the temperature gradient, extraction rate, and rotation speed facilitates the production of a single ingot with only trace amounts of unwanted instabilities. The process is normally performed in an inert atmosphere such as argon.

Individual wafers are basically created by slicing a thin layer of the semiconductor material off from this larger ingot. Wafers may be square, rectangular or circular and are frequently used in the fabrication of integrated circuits and other micro or electronic devices, such as solar panels. In one example, circular wafers are sliced off the end of the cylindrical ingot by a diamond coated wire roughly 20 micrometers in diameter. The problem with this production method is that the diamond wire shaves a portion of the ingot into dust in a thickness equal to the diameter of the diamond coated wire. Thus, for each circular wafer created, at least 20 micrometers of wafer material is wasted as dust residue.

But, these circular wafers are not preferred for use with solar panels because square or rectangular wafers better maximize surface area exposure to sunlight energy. To make square or rectangular wafers, the stock cylindrical ingot is, instead, first squared into an elongated rectangular box shape approximately 1.5 meters long. This squaring process uses a similar conventional 20 micrometer diameter diamond coated wire. Similar to the above, portions of the exterior of the ingot are lost to dust as the diamond wire cuts through portions of the ingot to form the rectangular block. Furthermore, this squaring process requires relatively large chunks of valuable and expensive wafer material to be chopped off and thrown away to square the cylindrical ingot. From here, individual square or somewhat rectangular wafers are sliced off the end of the rectangular semiconductor block, as described above with respect to the circular wafers. While hundreds of relatively square or rectangular wafers ranging in thickness from 160 to 200 micrometers can be sliced off this rectangular semiconductor block, each wafer cut wastes an amount of wafer material equal to the width of the diamond wire cutting the semiconductor block. Another drawback in cutting wafers with a diamond-coated wire is that the saw can cause surface damage to the wafer that requires repair.

Recently, newer technologies have been developed to create additional, thinner wafers from existing wafers cut from the silicon ingot or rectangular silicon block, as described above. For example, U.S. Pat. No. 7,939,812 to Glavish et al., U.S. Pat. No. 7,982,197 to Smick et al., U.S. Pat. No. 7,989,784 to Glavish et al., and U.S. Pat. No. 8,044,374 to Ryding et al., the contents of each reference are herein incorporated by reference in their entireties, disclose a hydrogen ion implanter used to exfoliate silicon wafers to produce a thinner lamina of crystalline semiconductor material. In this respect, the ion implanter penetrates the surface of a silicon wafer to a certain depth. This penetrated layer of silicon can then be peeled back away from the silicon wafer (i.e., exfoliated)—effectively creating a thinner silicon wafer using the original silicon wafer as a workpiece. Using this exfoliation process, a silicon wafer workpiece on the order of 160-200 micrometers can be used to create 8-10 new silicon wafers having a thickness of approximately 20 micrometers, with nearly no silicon material wasted during the process. Further to this concept, U.S. Pat. Nos. 8,058,626 and 8,089,050, both to Purser et al., the contents of which are both herein incorporated by reference, disclose embodiments for creating a modified ribbon-shaped ion beam having an elongated cross-section normal to the beam direction for use in the aforementioned process for implanting ions into the surface of a substrate.

The current exfoliation processes, such as those described above, require two steps to create a sheet of exfoliated wafer material. More specifically, individual wafers are exfoliated from an ingot in one process step and then the exfoliated layer or wafer is removed from the ingot in a second process step. This two-step conventional process is costly and time consuming by virtue of to its multi-step nature. Furthermore, this conventional process produces a large number of individual exfoliated sheets of wafer material that are relatively expensive to handle and stamp into individual wafers.

Typically, conventional solar cells are manufactured from silicon produced through the Czochralski process, which can result in undesirably high oxygen content (e.g., $10^{18}$ oxygen atoms per cubic centimeter) as a result of using a crucible. Impurities in silicon wafers, such as oxygen, reduce the voltage and current capacities of the solar cell. As such, lower oxygen content silicon such as float zone silicon ("FZ silicon") are more desirable as FZ silicon produces more efficient solar cells. FZ silicon is made in a process called vertical zone melting, wherein a polycrystalline rod of ultra-pure electronic grade silicon is passed through an RF heating coil to create a localized molten zone. A seed crystal is used at one end of the rod to start crystal ingot growth. The vertical zone melting process is carried out in an evacuated chamber or in an inert gas purge. Unlike the Czochralski process, the molten zone carries impurities such as oxygen away from the silicon ingot during growth (e.g., because most impurities are more soluble in the melt than the crystal), thereby reducing the impurity concentration within the silicon ingot. As such, FZ silicon is relatively more pure than silicon made from the Czochralski process. But, the problem with FZ silicon is that it must be cut into thicker than desired wafer sizes (e.g., on the order of 300-500 microns in thickness) because the rigid material properties prevent known methods (e.g., a diamond wire) from cutting the material any thinner. Thus, silicon wafers made from FZ silicon or the like are currently cost prohibitive due to material costs and limitations regarding the currently available minimum manufacturing thickness of the wafers.

There exists, therefore, a significant need in the art for processes and related apparatuses for more efficiently producing square and rectangular wafers from an FZ silicon stock ingot. Such processes and related apparatuses may include steps for mounting a square or rectangular FZ silicon ingot, penetrating a selected layer of the outer surface of the ingot, exfoliating away this bombarded layer of wafer material along one or more sides of the rectangular or square FZ silicon ingot, and conveying that strip of material to a press to be sliced into individual wafers, all without the waste associated with cutting or slicing the ingot into individual wafers with a diamond saw. Such processes and apparatuses may further be able to simultaneously exfoliate and remove a single continuous sheet of wafer material from the ingot. The present invention fulfills these needs and provides further related advantages.

SUMMARY OF THE INVENTION

One method for manufacturing a silicon wafer as disclosed herein, includes mounting a float zone silicon work piece for exfoliation, energizing a microwave device for generating an energized beam sufficient for penetrating an outer surface layer of the float zone silicon work piece, exfoliating the outer surface layer of the float zone silicon work piece with the energized beam and removing the exfoliated outer surface layer from the float zone silicon work piece as the silicon wafer having a thickness less than 100 micrometers, or more preferably a thickness of 2-70 microns or 4-20 microns. In one embodiment, the float zone silicon work piece may be a pre-cut float zone silicon work piece having a thickness of 160-600 microns and an oxygen content less than $10^{16}$ oxygen atoms per cubic centimeter.

The method may also include steps for cutting the silicon wafer into multiple silicon wafers and moving or conveying each of those multiple silicon wafers along a conveyor and away from the float zone silicon work piece. In one embodiment, the silicon wafers may be square. In another embodiment, the silicon wafers may be rectangular and be exfoliated from a rectangular float zone silicon work piece. Furthermore, the microwave device preferably includes a klystron for generating an energized beam that includes an ion beam or a proton beam and may approximately span the width of the float zone silicon work piece. In one embodiment, the energized beam may move relative to the float zone silicon work piece and include an implantation density of approximately $5 \times 10^{14}$ to $5 \times 10^{16}$ ions/cm$^2$.

In an alternative embodiment, the a method for manufacturing a silicon wafer includes mounting a float zone silicon work piece having an oxygen content less than $10^{16}$ oxygen atoms per cubic centimeter, energizing a microwave device for generating an energized beam having an implantation density of approximately $5 \times 10^{14}$ to $5 \times 10^{16}$ ions/cm$^2$ for penetrating an outer surface layer of the float zone silicon work piece, exfoliating the outer surface layer of the float zone silicon work piece with the energized beam, and removing the exfoliated outer surface layer from the float zone silicon work piece as the silicon wafer. Preferably, the silicon wafer has a thickness less than 100 micrometers, and more specifically a thickness of 4-20 microns. Additionally, the silicon wafers may be cut into multiple silicon wafers and moved away from the work piece along a conveyor.

Additionally, float zone silicon work piece may include a pre-cut float zone silicon work piece having a thickness of 160-600 microns, which may form square silicon wafers having a thickness of 2-70 microns. In this embodiment, the microwave device may include a klystron for generating the energized beam, which may include an ion beam or a proton beam. The energized beam may also move relative to the float zone silicon work piece or be approximately the same width as a rectangular float zone silicon work piece.

In another alternative method, manufacturing a plurality of silicon wafers may include steps for mounting a pre-cut float zone silicon work piece having an oxygen content less than $10^{16}$ oxygen atoms per cubic centimeter and having a thickness of 160-600 microns, energizing a microwave device for generating an energized beam sufficient for penetrating an outer surface layer of the float zone silicon work piece, exfoliating the outer surface layer of the float zone silicon work piece with the energized beam, wherein the energized beam moves relative to the float zone silicon work piece, removing the exfoliated outer surface layer from the float zone silicon work piece as the silicon wafer comprising a thickness of 2-70 microns, cutting the silicon wafer into multiple silicon wafers, and moving each of the multiple silicon wafers along a conveyor.

An apparatus as disclosed herein for manufacturing a plurality of silicon wafers from a float zone silicon work piece, may include a mount for selectively receiving and retaining the float zone silicon work piece having an exfoliation surface. A microwave may produce an energized beam that has an implantation density of approximately $5 \times 10^{14}$ to $5 \times 10^{16}$ ions/cm$^2$. The microwave is preferably positioned relative to the mount to emit the energized beam in the direction of the exfoliation surface, wherein relative movement of the microwave and the float zone silicon work piece exfoliates a silicon wafer having a thickness of less than 100 microns. A conveyor then longitudinally carries each of the plurality of silicon wafers exfoliated from the exfoliation surface away from the float zone silicon work piece.

In a preferred embodiment, the microwave includes a klystron or a DC accelerator, the energized beam includes an ion beam or a proton beam, and may be an elongated beam approximately the width of the exfoliation surface. Additionally, the float zone silicon work piece may include a rectangular shape and have an oxygen content less than $10^{16}$ oxygen atoms per cubic centimeter. Preferably, the silicon wafer exfoliated from the float zone silicon work piece has a thickness of 2-70 microns.

In additional alternative embodiments, the process for manufacturing wafers as disclosed herein includes the steps of mounting an ingot as a work piece in a manner that permits rotation about a longitudinal axis of rotation and rotating the ingot about the longitudinal axis of rotation. Preferably, the ingot is in the shape of a cylinder and carried by a rotatable shaft mountable to a rotor that facilitates the rotation of the cylindrical ingot about its longitudinal axis of rotation. The ingot may be made from monocrystalline or polycrystalline silicon. A microwave device for generating an energized beam sufficient for penetrating an outer surface layer of the rotating ingot is then energized. Accordingly, the outer surface layer of the rotating ingot is exfoliated with the energized beam. As the ingot continues to rotate, the exfoliated outer surface layer can then be removed from the ingot work piece as a continuous planar strip that can be cut into a wafer. At this time, the continuous planar strip may be transported along a conveyor moving at approximately the same speed as and preferably substantially synchronized with the angular velocity of the rotating ingot. In the event the ingot is incrementally rotated, the conveyor would also incrementally move the continuous planar strip forward in a similar incremental movement. Of course, the continuous strip may be cut or stamped by a press into a plurality of wafers.

Additionally, the wafer manufacturing process may also include the step of cooling the ingot at a penetration point where the energized beam bombards the outer surface layer of said ingot to prevent the chemical properties of the ingot material from changing as a result of increased local temperatures. Such a cooling step can be particularly preferred when the energized beam operates at an energy level between 0.15-1.7 megaelectron volts. The microwave device may be a klystron that generates an energized beam that includes a proton beam or an ion beam. Preferably, the microwave device is calibrated to maximize a Q value. Additionally, the energized beam may include multiple energized beams that simultaneously exfoliate respective outer surface layers of the rotating ingot, to simultaneously create multiple respective exfoliated outer surface layers that can be peeled or removed from the ingot work piece. In one embodiment, the energized beam(s) are approximately the width of the finalized wafer product. For example, the wafer may be square and have a width of between 160-200 mm with an outer surface layer thickness between 3-30 micrometers.

In another process for manufacturing wafers as disclosed herein, an ingot formed in the shape of a cylinder and carried by a rotatable shaft is mounted to a rotor capable of rotating the cylindrical ingot about its longitudinal axis of rotation. Next, the rotor activates and rotates the cylindrical ingot such that an energized beam generated by a microwave device can penetrate a predetermined outer surface layer of the rotating ingot. This permits the manufacturing process to exfoliate the outer surface layer away from the cylindrical ingot work piece as a continuous planar strip along a conveyor synchronized with the rotating ingot. The cylindrical ingot work piece may be cooled at the penetration point where the energized beam bombards the outer surface layer, to prevent the chemical properties of the ingot material from changing as a result of increased localized temperatures. The continuous strip of material is then stamped into a plurality of wafers usable in, for example, a solar panel or the like.

The microwave device may be calibrated to maximize a Q value so that an energized beam having an energy level between 0.15-1.7 megaelectron volts efficiently penetrates the outer surface of the rotating cylindrical ingot. In one embodiment, the microwave device is a klystron that generates a proton or ion energized beam. In another embodiment, the microwave device utilizes Electron Cyclotron Resonance to produce high current ions. Moreover, the process may include the use of multiple energized beams that simultaneously exfoliate respective outer surface sections of the rotating ingot, to more efficiently exfoliate the outer surface of the ingot along its entire vertical height. The energized beam is preferably approximately the width of the wafer product, such as between 160-200 mm. The cylindrical ingot may be made from monocrystalline or polycrystalline silicon and be rotated incrementally so that approximately an outer surface layer thickness between 3-30 micrometers is exfoliated.

The apparatus for manufacturing a wafer includes a rotator configured to selectively mountably receive and rotate an ingot work piece about a longitudinal axis of rotation. The ingot is preferably cylindrical and may be made from monocrystalline or polycrystalline silicon. A microwave for producing an energized beam is positioned relative to the rotator such that the emitted energized beam aligns with the longitudinal axis of rotation of the rotating ingot. The energized beam is preferably of an energy level sufficient to penetrate an outer surface layer of the rotating ingot. A water cooler or an air cooler positioned proximate to a penetration point where the energized beam bombards the outer surface layer of the ingot may control the surface temperature therein during the manufacturing. The apparatus also includes a conveyor synchronized with the rotating ingot to transversely carry as a continuous planar strip an exfoliated outer surface layer away from the rotating ingot. This continuous planar strip is then cut into one or more wafers by a cutting mechanism. In this respect, such a cutting mechanism may include a stamping die that cuts the continuous strip into multiple wafers with each stroke. The final wafer product is preferably of a width between 160-200 mm and a thickness between 3-30 micrometers. In a particularly preferred embodiment, the microwave is a klystron that includes an energy accelerator. To this end, the energized beam may be an ion beam or a proton beam, and is preferred to be elongated beam approximately the width of said wafer.

Other features and advantages of the present invention will become apparent from the following more detailed description, when taken in conjunction with the accompanying drawings, which illustrate, by way of example, the principles of the invention.

BRIEF DESCRIPTION OF THE DRAWINGS

The accompanying drawings illustrate the invention. In such drawings:

FIG. 2A is a diagrammatic view illustrating melting high-purity semiconductor grade wafer material with dopants in an inert chamber;

FIG. 2B is a diagrammatic view illustrating lowering a seed crystal mounted to one end of a rotatable shaft into the melted mixture;

FIG. 2C is a diagrammatic view illustrating catalytic crystallization of the melted mixture to the seed crystal;

FIG. 2D is a diagrammatic view illustrating formation of an ingot through controlled removal of the seed crystal from the mixture;

FIG. 2E is a diagrammatic view illustrating complete formation of an ingot from the melted mixture;

FIG. 3 is a diagrammatic perspective view illustrating mounting of the ingot at one end to a rotator;

FIG. 4 is a diagrammatic perspective view illustrating rotation of the ingot about its longitudinal axis when alternatively coupled to two rotators;

FIG. 11 is a diagrammatic view illustrating cutting a cylindrical ingot into a square or rectangular ingot with a diamond wire;

DETAILED DESCRIPTION OF THE PREFERRED EMBODIMENTS

Figure 1:
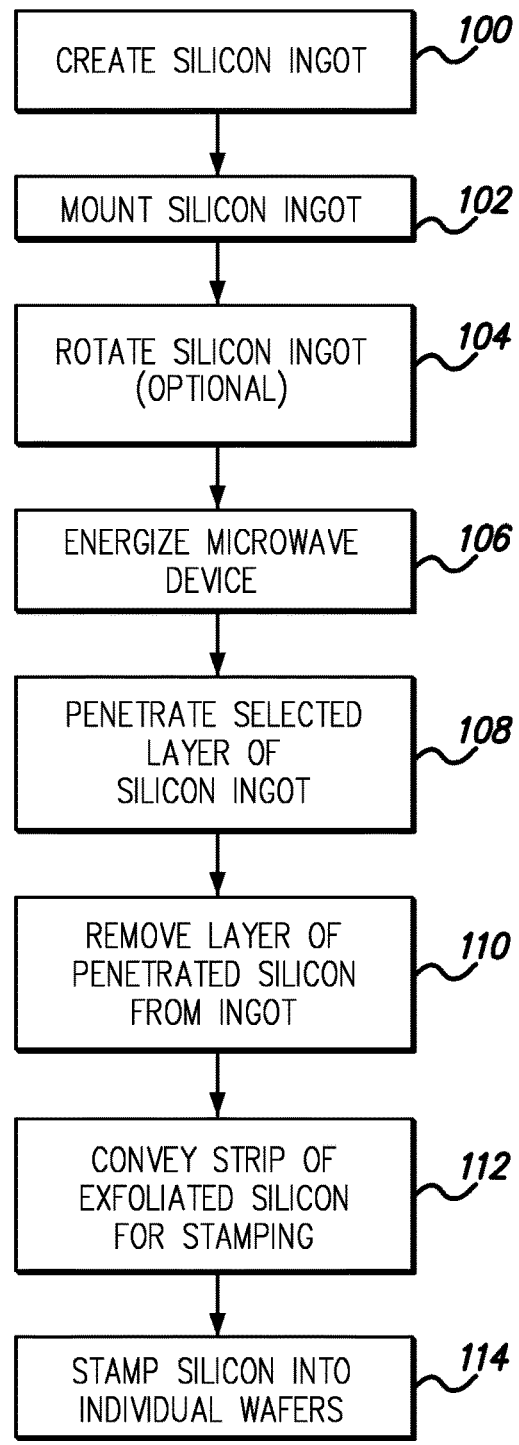
FIG. 1 is a flowchart illustrating the steps used in association with a method and process for manufacturing a wafer.

As shown in the drawings for purposes of illustration, the present invention for the improved processes for manufacturing wafers is shown generally with respect to the flowchart in FIG. 1 and the operation of the manufacturing process is shown in more detail in FIGS. 2-10. More specifically, the first step, as shown in FIG. 1, is to create an ingot 100. In a preferred embodiment, the ingot 100 is a monocyrstalline cylindrical silicon ingot. Although, the ingot 100 may be any material suitable for exfoliation, including polycrystalline silicon, and may have any cross-sectional shape, such as polygonal cross-sectional shape. One set of processes and apparatuses disclosed herein aim to, inter alia, reduce the waste associated with squaring off a cylindrical ingot used as a workpiece for creating square or rectangular silicon wafers for use with solar panels and the like. Furthermore, the processes and apparatuses disclosed herein are able to further reduce wasted wafer material by at least one order of magnitude for each wafer created in view of eliminating the need to slice individual wafers using the aforementioned diamond coated wire. Accordingly, eliminating both of these wasteful steps in producing solar grade monocrystalline photovoltaic material corresponds to a cost savings of the same magnitude. Thus, as will be described in more detail below, the amount of solar PV material produced increases by a factor of at least 20 over the same ingot used by traditional or conventional manufacturing methods. This obviously corresponds to tremendous cost savings in raw material. Additionally, simultaneously exfoliating and removing a continuous sheet of wafer material from the ingot, as described in more detail below, eliminates the need for the relatively more cost intensive two-step exfoliation process and decreases the costs associated with handling numerous individual sheets of exfoliated wafer material, as is known in the prior art.

As shown in FIG. 2A, high-purity semiconductor-grade wafer material 10 is melted in an inert chamber 12, such as a chamber made from quartz. Although the wafer material 10 may be any material suitable for exfoliation, monocrystalline silicon is the preferred wafer material. Dopants 14 (e.g., boron, phosphorus, arsenic, or antimony) are added to the melted wafer material 10 to add impurities thereto, preferably on the order of $10^{13}$ or $10^{16}$ atoms per $cm^3$ to polarize the composition as a n-type (negative) or p-type (positive) semiconductor. A seed crystal 16 mounted to one end of a rotatable shaft 18 is then lowered into this somewhat impure mixture 20 of the melted wafer material 10 and the dopants 14 to begin the crystallization process as shown in FIG. 2B. The seed crystal 16, once immersed into this mixture 20 as shown in FIG. 2C, acts as a catalyst to start crystallization of the melted wafer material mixture 20 about the shaft 18. The shaft 18 is then slowly pulled upwards and rotated simultaneously to extract a large ingot 22 from the melt. The ingot 22 is preferably a single-crystal cylindrical ingot, although the ingot 22 may be polycrystalline or another composition known in the art. The crystallization of the ingot 22 formed from the mixture 20 is indicated by the decreased amount of the mixture 20 in the inert chamber 12, progressing from FIG. 2C to FIG. 2E. In this respect, FIG. 2E illustrates one ingot 22 for use with the processes disclosed herein.

Persons of ordinary skill in the art will readily recognize that the above-described process for creating the ingot 22 in accordance with step 100 may vary depending on the desired application and end characteristics of the wafer. For example, one may vary the composition of the melted wafer material 10, the amount and/or types of dopants 14 introduced into and mixed with the melted wafer material 10, the temperature in the inert chamber 12, the angular rotating speed of the shaft 18, and the rate of extracting the seed crystal 16. In this respect, the wafer material creation process 100 should be considered well known to those skilled in the art. In a particularly preferred embodiment, the ingot 22 is an FZ silicon ingot made by the vertical zone melting process to reduce the number of impurities therein, especially oxygen impurities.

Once the ingot 22 has been created during step 100, the next step 102 in accordance with FIG. 1 is to mount the ingot 22 in preparation for the exfoliation process. In the preferred embodiment, the ingot 22 remains stationary after being mounted. In another embodiment, the ingot 22 may be mounted to the rotator 24 illustrated in FIG. 3. In one embodiment, the rotator 24 may couple to the shaft 18 or other extension extending out from the body of the ingot 22. In this embodiment, the rotator 24 is preferably capable of holding and rotating the ingot 22 in the generally horizontal position shown with respect to FIG. 3. Alternatively, as shown in FIG. 4, a pair of rotation arms 26, 26' may extend out from or comprise a portion of the rotator (generally designated as numeral 24) and attach to a pair of planar end surfaces 28, 28' of the ingot 22. Here, the rotation arms 26, 26' may include an attachment mechanism 30 in the form of a grip, clamp, or other device having a high friction surface to retain (e.g., by compression fit) the ingot 22 therebetween. In this respect, any attachment mechanism 30 known in the art capable of supporting and rotating the ingot 22 at a stable and consistent speed in connection with the rotator 24 will suffice. Moreover, the rotator(s) 24, the rotation arms 26, 26' or the attachment mechanism 30 could also be utilized individually or in combination with one another to move the mounted ingot 22 back and forth about its axis of rotation 32 during the ion implantation process, as described in more detail below.

Figure 5A:
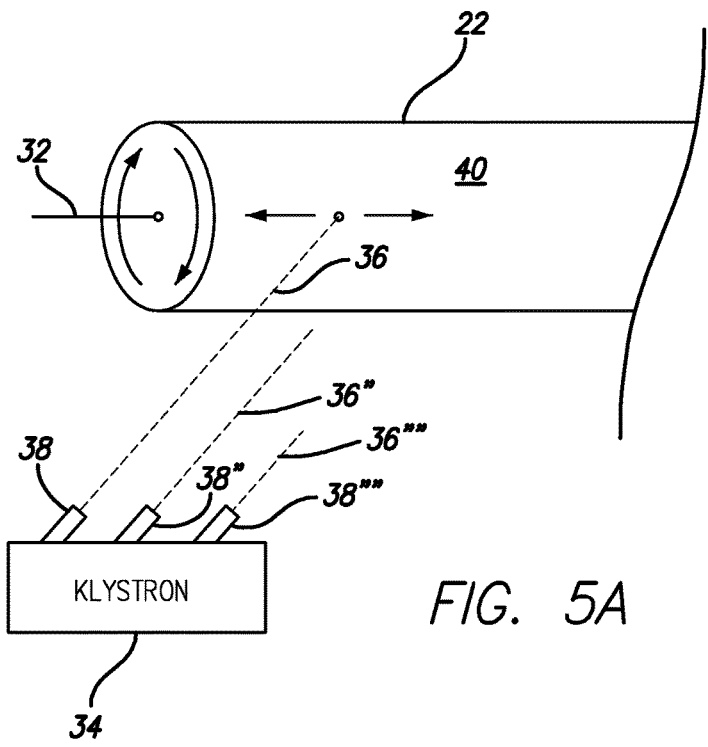
FIG. 5A is a partial cut-away diagrammatic perspective view illustrating bombardment of the outer surface of the ingot with one or more beams.
Figure 5B:
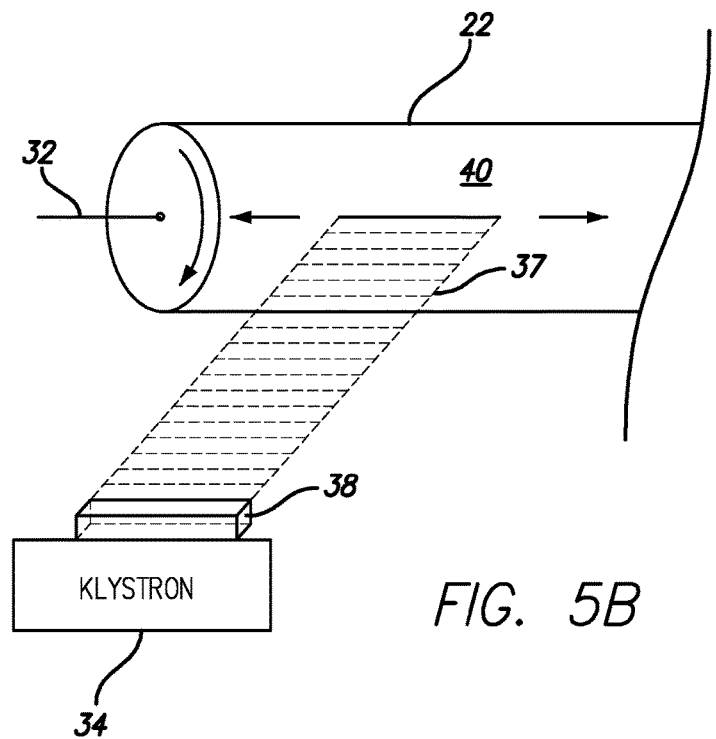
FIG. 5B is an alternative cut-away diagrammatic perspective view illustrating bombardment of the outer surface of the ingot with one or more elongated beams.

The next step as shown in FIG. 1 is to energize a microwave device 106 that produces a beam of energized protons or ions capable of penetrating into the outer surface of the ingot 22 as it rotates about the axis 32. Here, FIGS. 5A and 5B illustrate two examples of such a microwave device for use with the processes disclosed herein. For example, in FIG. 5A, the microwave device includes a klystron 34 (i.e., an electron tube used to generate or amplify electromagnetic radiation in the microwave region by velocity modulation) that generates a proton beam 36 (FIG. 5A) or an elongated proton beam 37 (FIG. 5B) out from an accelerator 38 directed toward the outer surface 40 of the ingot 22. It is preferred that the klystron 34 include a Direct Current Gun or a Pelletron accelerator 38, but other comparable accelerator devices known in the art, such as a radio frequency ("RF") accelerator, may be used as well. The accelerator 38 (e.g., an RF resonant cavity) guides microwaves from the klystron source 34 into a resonant cavity to produce high gradient electromagnetic fields that accelerate protons to a desired energy level. This minimizes the size of the microwave device (high eV/m), while maintaining high production value. In this respect, one klystron 34 may be attached to many RF resonant accelerating cavities (for example, additional accelerators 38', 38" as illustrated in FIG. 5A) by use of a highway of intersecting electromagnetic waveguides. Thus, an entire factory yielding Gigawatt per year production of PV material can be powered by just a single klystron 34. The resonant cavities are designed to maximize the quality factor, or Q value, thus minimizing the needed input energy of the microwave source.

The next step as shown in FIG. 1 is to penetrate a selected layer of the ingot 22. In the embodiment wherein the ingot 22 is rotating, the penetration preferably occurs approximately parallel to an axis of rotation 108 of the ingot 22. Exemplary devices known in the art for penetrating and essentially exfoliating a select surface depth of wafer material are shown and described, for example, in the aforementioned U.S. Pat. No. 7,939,812 to Glavish et al., U.S. Pat. No. 7,982,197 to Smick et al., U.S. Pat. No. 7,989,784 to Glavish et al., and U.S. Pat. No. 8,044,374 to Ryding et al. Here, the proposed method bombards the outer surface 40 of the ingot 22 to a predetermined depth 42 (FIG. 6) with the proton beam 36, 37 having energized protons preferably ranging in energy level from 0.2-2.5 megaelectron volt ("MeV"). Accordingly, the protons penetrate the ingot 22 to a skin depth 42 of approximately 3-30 micrometers. As the ingot 22 rotates about its axis 32, the proton beam 36, 37 continuously energizes a new layer of the outer surface 40. Of course, the depth 42 may vary depending on the type of microwave device, the energy level generated within the proton accelerator 38, etc. This proton bombardment step 108 allows a layer 44 of the bombarded surface 40 to be peeled or exfoliated away from the body of the ingot 22 and onto a continuous conveyor 46 as generally shown in FIG. 7. The skin depth 42 ranges from 3-30 micrometers depending on the energy of the injected protons.

During step 108, the bombarded surface of the ingot 22 increases in temperature as a result of the proton beam 36, 37. As such, a cooling mechanism is preferably utilized to cool the outer surface 40 of the ingot 22 to prevent adverse or unexpected changes in the material properties of the ingot 22 due to heating. In this respect, it is particularly important to cool the area in and around the ingot 22 being exfoliated. Water or air circulation-based cooling devices may be used with the processes disclosed herein to provide either direct or indirect cooling of the ingot 22.

Figure 6:
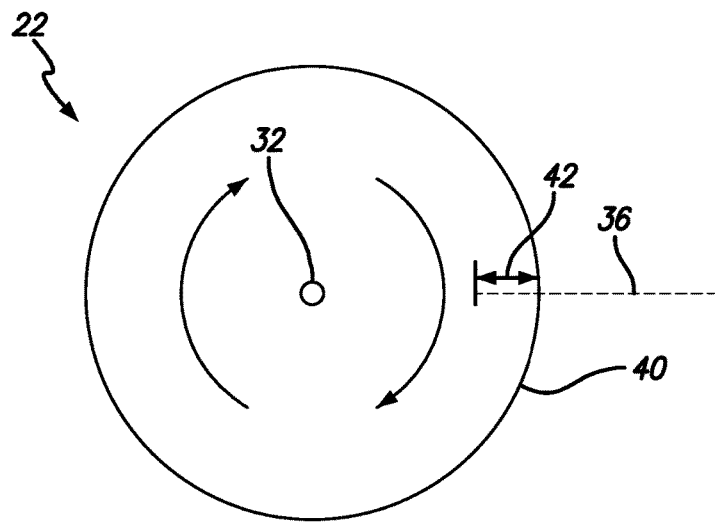
FIG. 6 is a diagrammatic side view of the ingot, illustrating protons penetrating the outer surface of the ingot to a predetermined depth.
Figure 7:
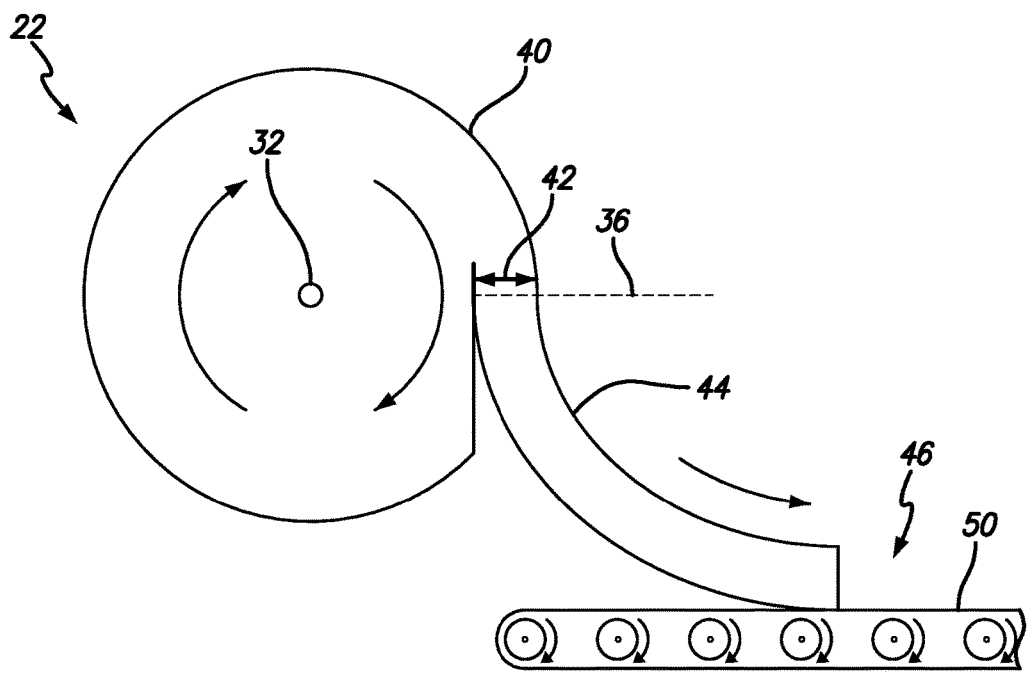
FIG. 7 is a diagrammatic side view of the ingot, illustrating exfoliation of the ingot.

The thickness of the exfoliated layer 44 is exaggerated in FIGS. 6 and 7 for illustrative purposes. In this respect, a person of ordinary skill in the art will readily recognize that relative thicknesses of this exfoliated layer 44 will be much thinner than the initial thickness of the ingot 22 made in accordance with step 100. In one embodiment, as the ingot 22 is continuously exfoliated about its axis 32, its diameter will decrease in size and the relative size differential relative to the depth 42 of the exfoliated layer 44 will decrease.

Figure 8A:
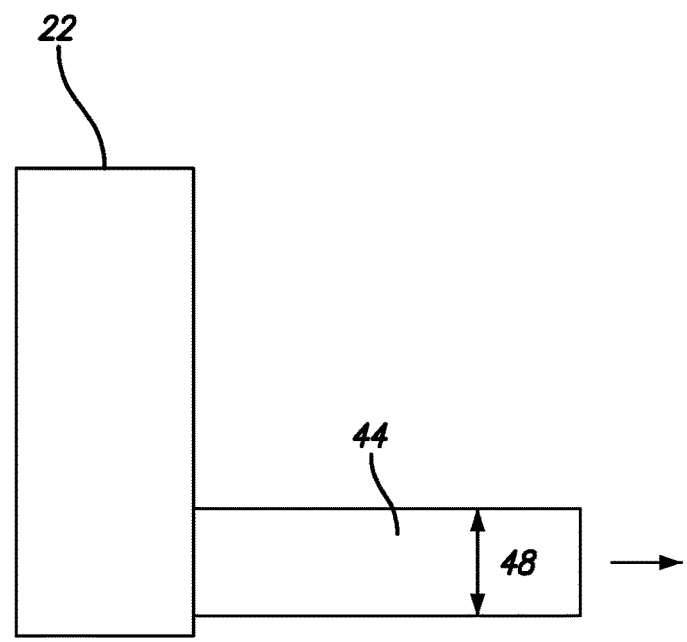
FIG. 8A is a diagrammatic top view of the bombarded ingot, illustrating single layer exfoliation.
Figure 8B:
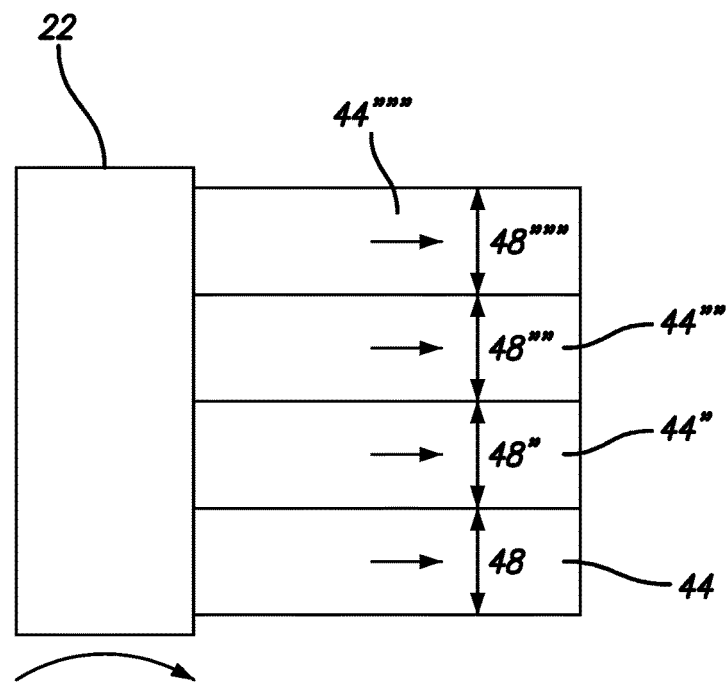
FIG. 8B is an alternative diagrammatic top view of the bombarded ingot, illustrating multi-layer exfoliation.

In general, the beam 36 or the elongated beam 37 needs to energize a portion of the ingot 22 along its length thereof in accordance with the desired width of the resultant wafer. This process may vary depending on the type of beam 36, 37 and the length of the ingot 22 created in step 100. For example, FIG. 5A illustrates one embodiment wherein a single beam 36 emits from one accelerator 38. Here, the beam 36 contacts a portion of the outer surface 40 at a single point. To create the layer 44 having a width 48 (FIGS. 8A, 8B), the beam 36 may move left-to-right and right-to-left along the longitudinal axis of the ingot 22 (i.e., parallel to the height or axis 32 of the ingot 22) to energize the full width 48 of the ingot 22. In this embodiment, the ingot 22 may incrementally rotate to allow the beam 36 to successfully traverse the width 48. Once it has done so, the ingot 22 rotates forward so the next increment of the outer surface 40 can be energized and exfoliated away from the body of the ingot 22. Additional accelerators 38', 38", 38''' producing additional beams 36', 36", 36''' may be included with the klystron 34 so that the entire width of the ingot 22 can be processed and exfoliated simultaneously to create, for example, layers 44, 44', 44" as shown in FIG. 8B. Alternatively, in lieu of moving any one of the beams 36, 36', 36''', the accelerators 38, 38', 38''', or the klystron 34, the ingot 22 itself may traverse back and forth.

Alternatively, as shown in FIG. 5B, the klystron 34 may produce the elongated beam 37 having a beam width equal to the width 48 of the desired finalized wafer. Similar to that described above with respect to the beam 36, multiple elongated beams 37, 37', 37''' (additional beams 37', 37''' not shown in FIG. 5B) may be used to exfoliate part of or substantially the entire width of the ingot 22 in a manner similar to that described above with respect to FIG. 8B. The advantage of using one or more of the elongated beams 37 is that it may not be necessary to stop or increment rotation of the ingot 22 about its axis 32. In this respect, rotation and cooling of the ingot 22 may be timed to specifically facilitate continuous exfoliation as the beam 37 would not otherwise require longitudinal movement along the length of the ingot 22, as does the beam 36.

The next step as shown in FIG. 1 is to remove the layer of penetrated wafer material from the ingot 110. As described above with respect to one embodiment, the ingot 22 may rotate angularly about the axis of rotation 32 so that the beam 36, 37 does not overlap any previously bombarded area of the surface 40. As the bombardment process continues, the layer 44 of exfoliated material peels away from the ingot 22 on to the conveyor 46. The conveyor 46 may include a metal substrate 50 or other comparable surface having a high enough coefficient of friction to grasp or pull the exfoliated layer 44 away from the ingot 22, as generally shown in FIG. 7. This prevents the exfoliated layer 44 from bunching near the surface 40 as the ingot 22 rotates.

The rotation of the ingot 22 permits simultaneous exfoliation and removal of exfoliated material in a single, continuous sheet. More specifically, as the ingot 22 rotates the portion of the outer surface 40 of the ingot 22 being exfoliated changes as the angular position of the ingot 22 changes. Simultaneously, this rotation causes the layer of exfoliated wafer 44 material to peel off of the ingot 22 as the ingot 22 rotates. Since the exfoliated layer 44 continuously peels off the ingot 22 as its angular position changes, a single continuous sheet of wafer material is produced. That is, the rotating ingot 22 "unwinds" in the same manner that a roll of paper or a coil of metal. This process provides a large savings over conventional exfoliation processes since a continuous sheet of exfoliated wafer material is produced.

The removal step 110 may produce a ribbon of one or more substrate layers 44, 44', 44" (e.g., as shown in FIG. 8B) of wafer material 3-30 micrometers thick, depending on the bombarding proton energy. The ingot 22 moves forward a distance equal to the width of the metal substrate producing exactly enough material to be exfoliated onto the metal substrate 50 of the conveyor 46. The width of the metal substrate will correspond to the width 48 of the bombarded ingot surface, and can range from 160-200 mm.

Figure 9:
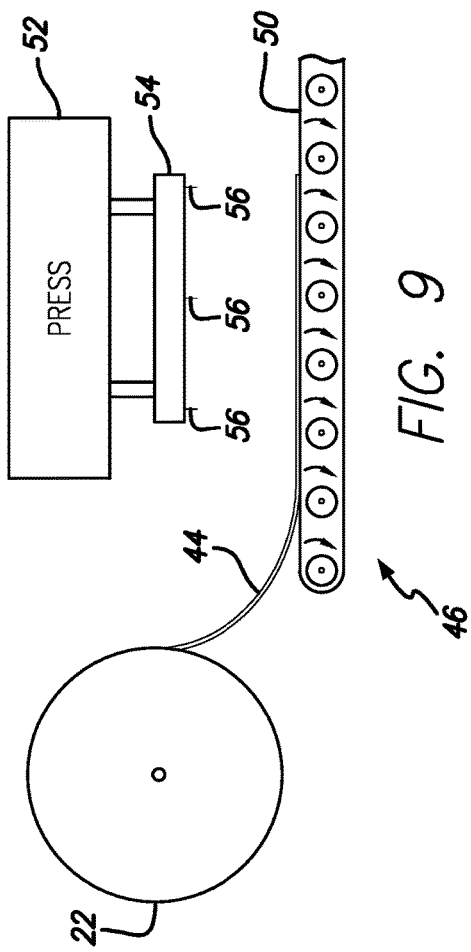
FIG. 9 is a diagrammatic side view illustrating conveying the exfoliated layer away from the ingot.
Figure 10:
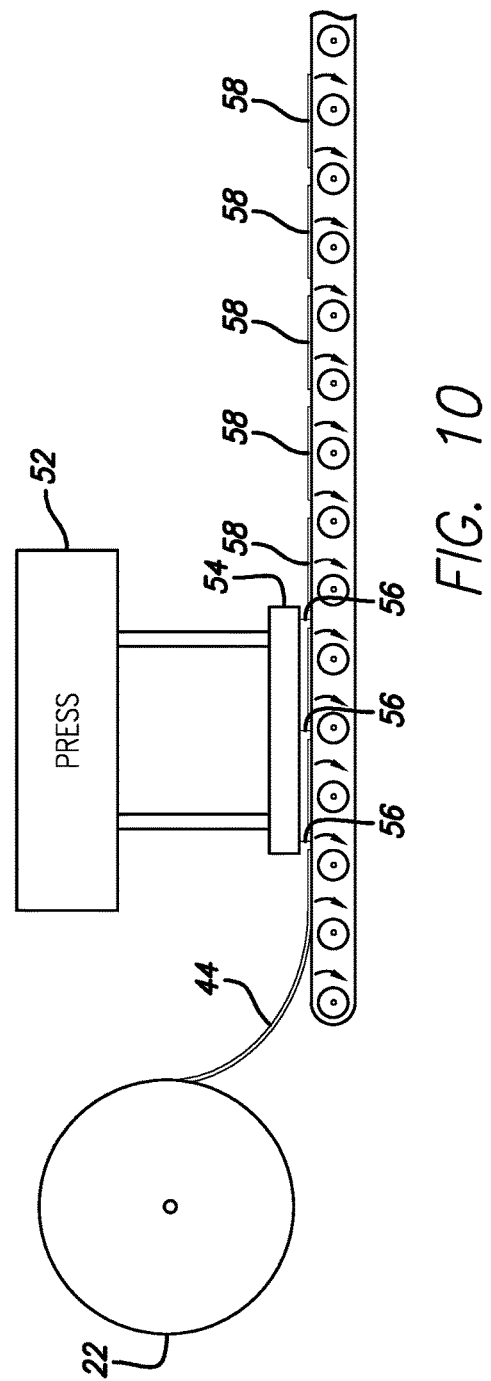
FIG. 10 is a diagrammatic side view illustrating cutting the exfoliated layer into individual wafers.

This new ribbon or layer 44 of metal substrate with PV material is then conveyed away from the ingot 22 during step 112 for subsequent stamping 114 into individual wafers (FIG. 1). In this respect, FIG. 9 illustrates movement of the layer or strip of exfoliated wafer material 44 away from the ingot 22 and toward a press 52 having a die 54 with one or more blades 56 designed to cut or shear the ribbon or layer 44 into individual wafers 58 (FIG. 10) at specific intervals. For example, when the press 52 extends the die 54 downwardly as shown in FIG. 10, the blades 56 contact and cut the strip of wafer material 44 into wafers 58 at intervals such as every 160-200 mm, thereby producing 160×160 mm wafers or 200×200 mm wafers. While these sizes may be the current dimensions of an average square PV wafer, the size of the wafer 58 should not be limited thereto. That is, the resultant size of the wafer 58 could be larger or smaller depending on the technology used to cut the layer 44 into the individual wafers 58. Furthermore, any device known in the art for slicing or cutting strips of wafer material may be utilized to create the wafers 58 from the strip or layer 44, such as alternative stamping or sawing mechanisms. Preferably, such a cutting or sawing step should create as little residual wafer material waste as possible. At this point, the final product is a square or rectangular PV wafer 58 that can run through conventional wiring and packaging machinery to produce a complete solar panel for use in residential, commercial, or utility scale solar energy production.

Of course, the processes and apparatuses described above should not be limited only to use with monocrystalline silicon ingots. Such processes and apparatuses may be applied to ingots of various shapes, sizes and materials, such as any type of metal material cast into a shape suitable for further processing as disclosed herein, including FZ silicon.

For example, the ingot 22 may have a polygonal cross section. An ingot having such a shape may be rotated about its longitudinal axis in the same manner as a cylindrical ingot. Most rotationally processed work pieces (i.e. work pieces turned on a rotator or lathe) must be cylindrical so the tool (i.e. lathe cutter) remains in contact with the work piece throughout the entire 360-degree rotation thereof. The exfoliation process, however, does not require a fixed position tool to remain in constant contact with the ingot. Instead, an energized beam that can accommodate the varying rotational diameter of a non-circular, rotating object preferably processes the work piece ingot. That is, the energized beam bombards the outer surface of the ingot and penetrates a layer of wafer material even though the diameter of the rotating ingot has a polygonal cross section that varies angularly. Therefore, ingots having a polygonal cross section may be exfoliated in the same manner as cylindrical ingots, as discussed in greater detail above.

Additionally, the wafer material is not limited to monocrystalline silicon. Any suitable material known in the art for construction of wafers may be used, including, but not limited to, float zone silicon ("FZ silicon"), polycrystalline silicon, cadmium telluride, sapphire crystal, and copper indium gallium selenide. Moreover, the wafer material can be either an n-type or p-type material. Obviously, the type and concentration of dopants and the specific processing parameters, such as temperatures, may vary depending on the choice of wafer material.

In another alternative aspect of the embodiments disclosed herein, the improved processes for manufacturing wafers could include the use of float zone silicon or FZ silicon. In this respect, the manufacturing process could be similar to the apparatuses and processes described above with respect to steps (100)-(114). Alternatively, instead of using the cylindrical ingot 22 as shown in FIGS. 3-10, the ingot 22 could be initially cut or squared-off by a diamond wire 60 or other comparable cutting mechanism to form a generally rectangular silicon block 62 as shown generally in FIG. 11. Of course, the silicon block 62 could be cut as a rectangle or square, and could be cut to a number of different sizes or shapes, as desired. In the embodiment shown in FIG. 11, the silicon block 62 has a front work surface 64 (and similarly shaped rear work surface 64') and a side work surface 66 (and corresponding other side work surfaces 66'-66''') of up to three feet long, all of which are preferably ready for exfoliation in accordance with the embodiments described herein. For purposes of simplicity, the exfoliation process is described below with respect to the front work surface 64 and the side work surface 66, but the exfoliation process may work equally well alone or simultaneously with one or more of the work surfaces 64' and 66'-66".

Alternatively, the exfoliation process disclosed herein could be used with float zone silicon wafers that have already been cut into thicknesses on the order of 200-600 microns by methods known in the art. In this respect, these existing or pre-cut wafers could be exfoliated to form multiple thinner wafers on the order of 2-70 micrometers, or more preferably on the order of 4-20 micrometers. For example, a 300 micrometer pre-cut float zone wafer could be exfoliated with the processes disclosed herein to produce 12 float zone wafers having a 25 micrometer thickness. Such pre-cut float zone wafers would essentially be used as a work piece in place of the silicon block 62 described below in more detail.

Once the silicon block 62 has been created using methods known in the art, the block 62 may be mounted for preparation of the exfoliation process, in accordance with the embodiments described above, or other embodiments known in the art. Although, one difference is that the silicon block 62 need not be rotated as described above with respect to the cylindrical silicon ingot 22 because the work surfaces 64, 66 provide a planar exfoliating surface as opposed to a rounded or cylindrical work surface that requires rotation about its axis to produce a flat wafer material.

Figure 12A:
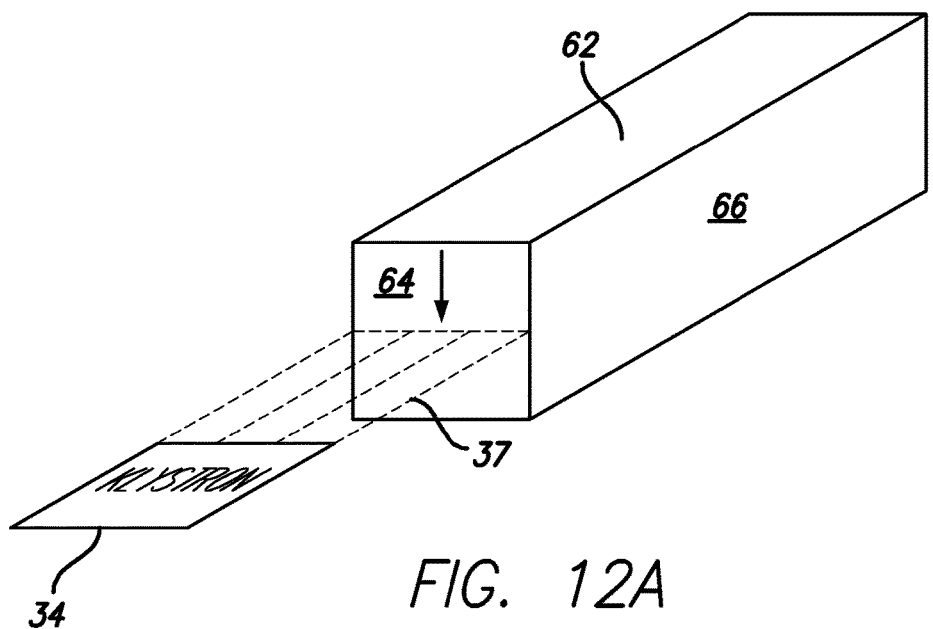
FIG. 12A is a diagrammatic perspective view illustrating bombardment of the outer front work surface of the squared off ingot of FIG. 11 with an elongated beam.
Figure 12B:
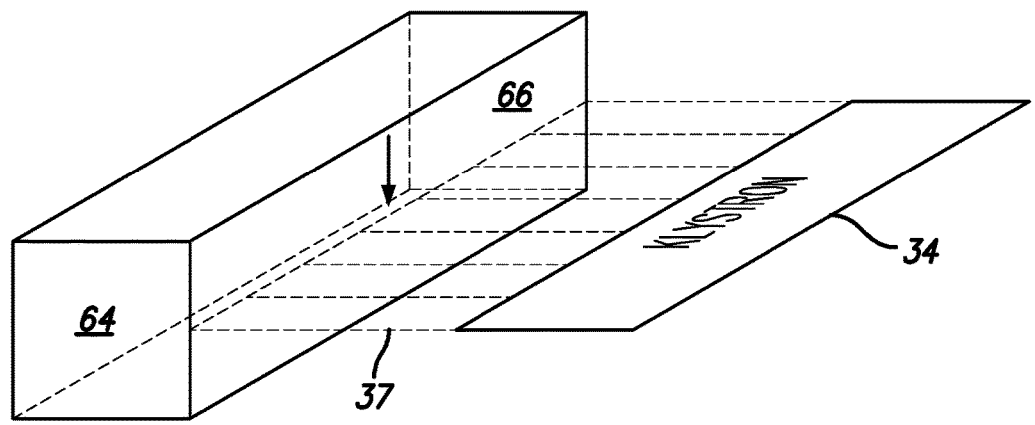
FIG. 12B is a diagrammatic perspective view illustrating bombardment of the outer side work surface of the squared off ingot of FIG. 11 with an elongated beam.
Figure 13A:
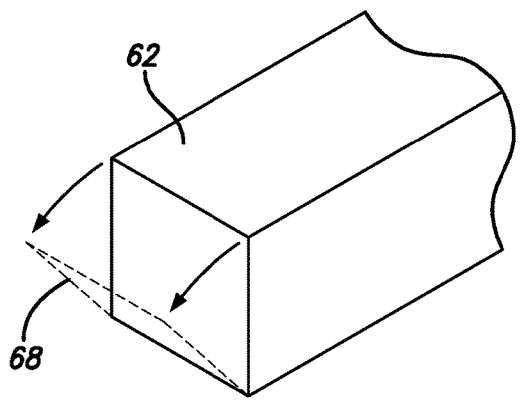
FIG. 13A is a diagrammatic perspective view illustrating an exfoliated layer peeling away from the front work surface exfoliated in FIG. 12A.
Figure 13B:
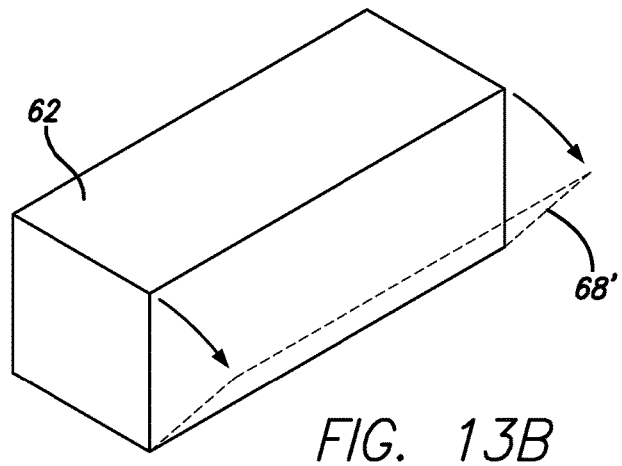
FIG. 13B is a diagrammatic perspective view illustrating an exfoliated layer peeling away from the side work surface exfoliated in FIG. 12B.
Figure 14:
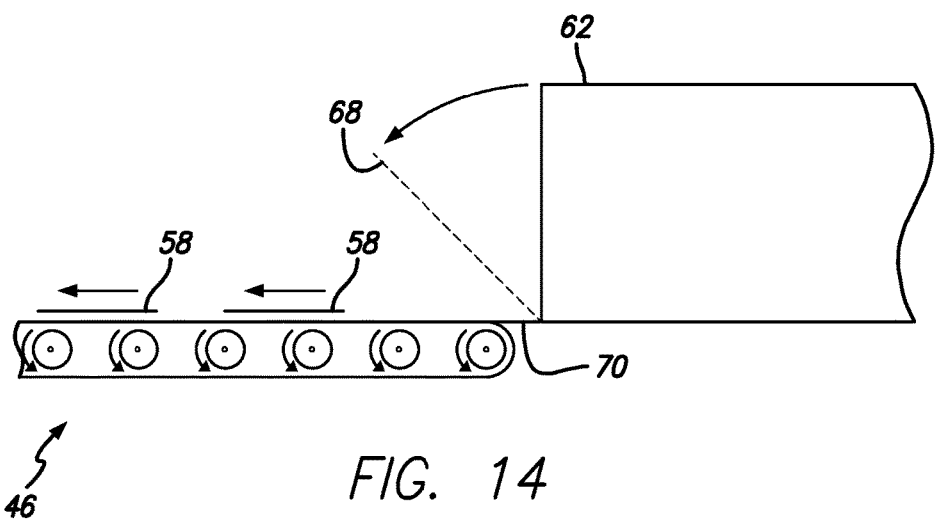
FIG. 14 is a diagrammatic side view illustrating the exfoliated layers being carried away from the work piece by a conveyor.

In this respect, FIGS. 12A and 12B illustrate two methods of exfoliating the outer work surfaces 64, 66 described above. For example, in FIG. 12A, the klystron 34 produces the elongated proton beam 37 for contact about the width of the front work surface 64. The beam 37 is preferably moved top down as indicated by the directional arrow. FIG. 12B illustrates a similar embodiment, wherein the klystron 34 produces similar elongated proton beam 37 that preferably spans the width of the side work surface 66 and moves top-down as indicated by the directional arrow. In this respect, as shown in FIGS. 13A and 13B, an exfoliated layer of silicon material 68, 68' begins to exfoliate off or peel away from the silicon block 62, in accordance with the embodiments described above. Similarly, this exfoliated layer 68 or 68' may be conveyed away from the work piece 62 by a conveyor 46 or the like (FIG. 14). The exfoliation process could create individual silicon wafers 58, for example by exfoliating a front work surface 64 that matches the desired dimensions of the resultant silicon wafer 58, or by exfoliating a larger area (e.g., by way of the side work surface 66), and then later cutting the strip of exfoliated silicon into strips as described above with respect to the exfoliated layer 44.

One particular advantage of the embodiments disclosed herein is the use of the exfoliation process with float zone (i.e., "FZ" silicon) or other silicon materials having relatively lower oxygen content (e.g., $10^{15}$ oxygen atoms per cubic centimeter). On one hand, current solar grade silicon material used to create silicon wafers sized for use in solar panels have a relatively higher oxygen content (e.g., $10^{18}$ oxygen atoms per cubic centimeter) and are produced by the Czochralski process. These silicon wafers only have an efficiency of 19%-20%, but are economical to produce. On the other hand, silicon materials having a comparatively low oxygen content and therefore higher efficiency (e.g., float zone silicon wafers have an efficiency of approximately 24.7%) must be cut into larger than desired sizes (e.g., on the order of 300-500 microns in thickness) because the rigid material properties prevent known methods (e.g., a diamond wire) from cutting the material any thinner. Thus, silicon wafers made from float zone silicon or the like are currently cost prohibitive due to material costs and the currently available minimum manufacturing thickness of the wafers.

Accordingly, the exfoliation processes described above are particularly useful in economically producing silicon wafers from a higher grade silicon material (e.g., float zone silicon) that has a relatively lower oxygen content and a smaller thickness (e.g., 2-70 microns, and preferably 4-20 microns, as opposed to 100+ microns). This is accomplished by bombarding the surface area structure of the float zone silicon with the aforementioned methods for ion implantation, such as by way of a DC accelerator or other beam having enhanced energy levels. The surface area bombardment is particularly preferred over known methods because the surface area tension of higher purity silicon material prohibits physically sawing off (e.g., by a diamond wire) wafers to economical thicknesses (e.g., under 100 microns).

As shown in FIGS. 13A, 13b and 14, the exfoliated layer 68 or 68' peels away from the silicon block 62 by a thickness determined by the energy level of the ions bombarding the surface thereof. In this respect, increasing the energy level of the beam 37 results in deeper surface level penetration and a thicker wafer 58, while decreasing the energy level of the beam 37 results in shallower surface level penetration and a thinner wafer 58. More specifically, using the implantation density of approximately $5 \times 10^{14}$ to $5 \times 10^{16}$ ions/cm$^2$ will penetrate the surface level of the float zone silicon to a depth sufficient to produce wafers 58 having a relative thickness of 2-70 microns, and preferably 4-20 microns. These relatively thin wafers 58 may be placed on the conveyor 46 having a surface that includes a conductive surface or backing 70 to pull the wafers 58 away from the silicon block 62 as each wafer 58 is produced.

Although several embodiments have been described in detail for purposes of illustration, various modifications may be made without departing from the scope and spirit of the invention. Accordingly, the invention is not to be limited, except as by the appended claims.

What is claimed is:

1. A method for manufacturing a silicon wafer, comprising the steps of:
   mounting a stationary silicon work piece having a polygonal cross section for exfoliation;
   energizing a microwave device for generating an energized beam sufficient for penetrating an outer surface layer of the polygonal cross section of the stationary silicon work piece;
   exfoliating the outer surface layer of the polygonal cross section of the stationary silicon work piece with the energized beam;
   applying a coolant to the outer surface layer of the stationary silicon work piece for cooling the stationary silicon work piece at a penetration point where the energized beam bombards the outer surface layer of the stationary silicon work piece sufficient to substantially prevent changes in the chemical properties of the stationary silicon work piece at the penetration point as a result of increased local temperatures; and
   removing the exfoliated outer surface layer from the stationary silicon work piece as the silicon wafer comprising a thickness less than 100 micrometers.

2. The method of claim 1, wherein the stationary silicon work piece comprises a pre-cut silicon work piece having a thickness of 160-600 microns.

3. The method of claim 1, wherein the stationary silicon work piece includes an oxygen content comprising less than $10^{15}$ oxygen atoms per cubic centimeter.

4. The method of claim 1, wherein the silicon wafer comprises a thickness of 2-70 microns.

5. The method of claim 1, wherein the silicon wafer comprises a thickness of 4-20 microns.

6. The method of claim 1, wherein the energized beam comprises an implantation density of approximately $5 \times 10^{14}$ to $5 \times 10^{16}$ ions/cm$^2$.

7. The method of claim 1, including the step of cutting the silicon wafer into multiple silicon wafers.

8. The method of claim 7, including the step of moving each of the multiple silicon wafers along a conveyor.

9. The method of claim 1, wherein the silicon wafer comprises a square silicon wafer.

10. The method of claim 1, wherein the microwave device comprises a klystron for generating the energized beam comprising an ion beam or a proton beam.

11. The method of claim 1, wherein the energized beam comprises a width approximately the same as the width of the stationary silicon work piece.

12. The method of claim 11, wherein the energized beam moves relative to the stationary silicon work piece.

13. The method of claim 1, wherein the stationary silicon work piece comprises a rectangular shape.

14. A method for manufacturing a silicon wafer, comprising the steps of:
   mounting a stationary silicon work piece having a polygonal cross section comprising an oxygen content less than $10^{15}$ oxygen atoms per cubic centimeter;
   energizing a microwave device for generating an energized beam comprising an implantation density of approximately $5 \times 10^{14}$ to $5 \times 10^{16}$ ions/cm2 for penetrating an outer surface layer of the polygonal cross section of the stationary silicon work piece;
   exfoliating the outer surface layer of the polygonal cross section of the stationary silicon work piece with the energized beam;
   applying a coolant to the outer surface layer of the stationary silicon work piece for cooling the stationary silicon work piece at a penetration point where the energized beam bombards the outer surface layer of the stationary silicon work piece sufficient to substantially prevent changes in the chemical properties of the stationary silicon work piece at the penetration point as a result of increased local temperatures; and removing the exfoliated outer surface layer from the stationary silicon work piece as the silicon wafer comprising a thickness less than 100 micrometers.

15. The method of claim 14, wherein the stationary silicon work piece comprises a pre-cut silicon work piece having a thickness of 160-600 microns.

16. The method of claim 14, wherein the silicon wafer comprises a thickness of 4-20 microns.

17. The method of claim 14, including the step of cutting the silicon wafer into multiple silicon wafers and moving each of the multiple silicon wafers along a conveyor.

18. The method of claim 14, wherein the silicon wafer comprises a square silicon wafer having a thickness of 2-70 microns.

19. The method of claim 14, wherein the microwave device comprises a klystron for generating the energized beam comprising an ion beam or a proton beam, wherein the energized beam moves relative to the stationary silicon work piece.

20. The method of claim 14, wherein the energized beam comprises a width approximately the same as the width of a rectangular stationary silicon work piece.

21. A method for manufacturing a plurality of silicon wafers, comprising the steps of:

mounting a stationary silicon work piece having a polygonal cross section comprising an oxygen content less than $10^{15}$ oxygen atoms per cubic centimeter and having a thickness of 160-600 microns;

energizing a microwave device for generating an energized beam sufficient for penetrating an outer surface layer of the polygonal cross section of the stationary silicon work piece;

exfoliating the outer surface layer of the polygonal cross section of the stationary silicon work piece with the energized beam;

applying a coolant to the outer surface layer of the stationary silicon work piece for cooling the stationary silicon work piece at a penetration point where the energized beam bombards the outer surface layer of the stationary silicon work piece sufficient to substantially prevent changes in the chemical properties of the stationary silicon work piece at the penetration point as a result of increased local temperatures;

removing the exfoliated outer surface layer from the stationary silicon work piece as the silicon wafer comprising a thickness of 2-70 microns, wherein the energized beam moves relative to the stationary silicon work piece;

cutting the silicon wafer into multiple silicon wafers; and moving each of the multiple silicon wafers along a conveyor.

* * * * *